US009706272B2

(12) United States Patent
Dupas et al.

(10) Patent No.: US 9,706,272 B2
(45) Date of Patent: Jul. 11, 2017

(54) BIT-INTERLEAVER FOR AN OPTICAL LINE TERMINAL

(71) Applicant: Alcatel Lucent, Boulogne-Billancourt (FR)

(72) Inventors: Arnaud Dupas, Nozay (FR); Roger Boislaigue, Nozay (FR)

(73) Assignee: Alcatel Lucent, Boulogne-Billancourt (FR)

( * ) Notice: Subject to any disclaimer, the term of this patent is extended or adjusted under 35 U.S.C. 154(b) by 109 days.

(21) Appl. No.: 14/409,421

(22) PCT Filed: Jul. 23, 2013

(86) PCT No.: PCT/EP2013/065455
§ 371 (c)(1),
(2) Date: Dec. 18, 2014

(87) PCT Pub. No.: WO2014/019881
PCT Pub. Date: Feb. 6, 2014

(65) Prior Publication Data
US 2015/0172793 A1 Jun. 18, 2015

(30) Foreign Application Priority Data
Aug. 1, 2012 (EP) .................................... 12305947

(51) Int. Cl.
*H04Q 11/00* (2006.01)
*H04L 1/00* (2006.01)
(Continued)

(52) U.S. Cl.
CPC ........ *H04Q 11/0005* (2013.01); *H03M 13/27* (2013.01); *H03M 13/2703* (2013.01);
(Continued)

(58) Field of Classification Search
CPC ... H04L 1/0071; H03M 13/27; H03M 13/275; H03M 13/2703; H03M 13/2757;
(Continued)

(56) References Cited

U.S. PATENT DOCUMENTS 5,928,371 A * 7/1999 Robinson, Jr. ........ H04L 1/0071
714/702
6,023,783 A 2/2000 Divsalar et al.
(Continued)

FOREIGN PATENT DOCUMENTS

CN 1618175 A 5/2005
CN 1890934 A 1/2007
(Continued)

OTHER PUBLICATIONS

Cheng et al., An Interleaver Implementation for the Serially Concatenated Pulse-Position Modulation Decoder, May 2006, IEEE, pp. 1-4.*
(Continued)

*Primary Examiner* — John T Tabone, Jr.
(74) *Attorney, Agent, or Firm* — Harness, Dickey & Pierce, P.L.C.

(57) ABSTRACT

Proposed is a bit-interleaver for an optical line terminal of an optical access network. The bit-interleaver contains a memory reader, that provides data streams at bit level to a space-time switch. The space-time switch reads within one input cycle up to N bit sets from the data streams. The switch switches within one writing cycle up to N bits onto up to its output ports, which provide respective output vectors. A number of N OR-function elements determine within the writing cycle respective single output bits. A number of N memory elements write within the one writing cycle a respective one of the output bits into a respective one of their bit sub-elements. A control unit that controls the reading of
(Continued)

the data streams and also the switching of the bits by the switch. The control unit controls a choice of the writing addresses.

7 Claims, 7 Drawing Sheets

(51) Int. Cl.
    *H03M 13/27*     (2006.01)
    *H03M 13/00*     (2006.01)

(52) U.S. Cl.
    CPC ..... *H03M 13/275* (2013.01); *H03M 13/2757* (2013.01); *H03M 13/2771* (2013.01); *H03M 13/2778* (2013.01); *H03M 13/2782* (2013.01); *H03M 13/6561* (2013.01); *H04L 1/0071* (2013.01); *H04Q 11/0003* (2013.01)

(58) Field of Classification Search
    CPC ......... H03M 13/2771; H03M 13/2778; H03M 13/2782; H03M 13/6561; H04Q 11/0003; H04Q 11/0005
    USPC ................................ 714/701, 702, 756, 762
    See application file for complete search history.

(56) References Cited

U.S. PATENT DOCUMENTS

| | | | | |
|---|---|---|---|---|
| 6,625,234 | B1* | 9/2003 | Cui | H03M 13/2703 375/341 |
| 6,625,763 | B1* | 9/2003 | Boner | H03M 13/2703 341/81 |
| 6,701,482 | B2* | 3/2004 | Salvi | H03M 13/23 714/755 |
| 6,954,885 | B2* | 10/2005 | Hurt | H03M 13/235 714/701 |
| 7,127,004 | B1* | 10/2006 | Sonning | H03M 13/2707 375/295 |
| 7,783,936 | B1* | 8/2010 | Hall | G06F 11/1008 714/701 |
| 2002/0035709 | A1* | 3/2002 | Chen | H03M 13/271 714/702 |
| 2003/0101401 | A1* | 5/2003 | Salvi | H03M 13/23 714/755 |
| 2003/0140304 | A1* | 7/2003 | Hurt | H03M 13/235 714/786 |
| 2003/0225985 | A1* | 12/2003 | Suzuki | H03M 13/258 711/157 |
| 2004/0139383 | A1* | 7/2004 | Salvi | H03M 13/23 714/759 |
| 2004/0268207 | A1* | 12/2004 | Sharma | G11C 7/1006 714/763 |
| 2006/0153285 | A1* | 7/2006 | Modlin | H04L 1/0002 375/222 |
| 2006/0239262 | A1 | 10/2006 | Wu et al. | |
| 2007/0061666 | A1* | 3/2007 | Nakai | H03M 13/2771 714/755 |
| 2007/0110180 | A1 | 5/2007 | Hammerschmidt et al. | |
| 2009/0060068 | A1* | 3/2009 | Goswami | H03M 13/275 375/260 |
| 2009/0245423 | A1* | 10/2009 | RostamPisheh | H03M 13/2757 375/316 |
| 2010/0318755 | A1* | 12/2010 | Berkmann | H04L 1/005 711/157 |
| 2011/0083051 | A1* | 4/2011 | Chin | H03M 13/271 714/752 |
| 2011/0113305 | A1* | 5/2011 | Liu | H03M 13/2707 714/773 |
| 2012/0079340 | A1* | 3/2012 | Gunnam | H03M 13/1137 714/752 |
| 2012/0121265 | A1 | 5/2012 | Suvakovic et al. | |
| 2015/0172793 | A1* | 6/2015 | Dupas | H04L 1/0071 398/46 |

FOREIGN PATENT DOCUMENTS

| | | | |
|---|---|---|---|
| CN | 101520529 A | 9/2009 | |
| CN | 100591165 C | 2/2010 | |
| CN | 102017429 A | 4/2011 | |
| JP | H09506750 A | 6/1997 | |
| JP | 2006311552 A | 11/2006 | |
| SE | EP 1085660 A1 * | 3/2001 | .......... H03M 13/235 |
| TW | I220342 B | 8/2004 | |
| TW | 200601851 | 1/2006 | |

OTHER PUBLICATIONS

International Search Report PCT/ISA/210 for International Application No. PCT/EP2013/065455 Dated Oct. 14, 2013.
Written Opinion of the International Searching Authority PCT/ISA/237 for International Application No. PCT/EP2013/065455 dated Oct. 14, 2013.
Taiwan Search Report 102126108 dated Nov. 20, 2014.
Dusan Suvakovic et al, Low Energy Bit- Interleaving Downstream Protocol for Passive Optical Networks, Online Conference on Green Communications (GreenCom), 2012, 26-31.
Dusan Suvakovic et al, A Low-Energy Rate-Adaptive Bit-Interleaved Passive Optical Network, Selected Areas in Communications, Aug. 7, 2014, 1552-1565.

* cited by examiner

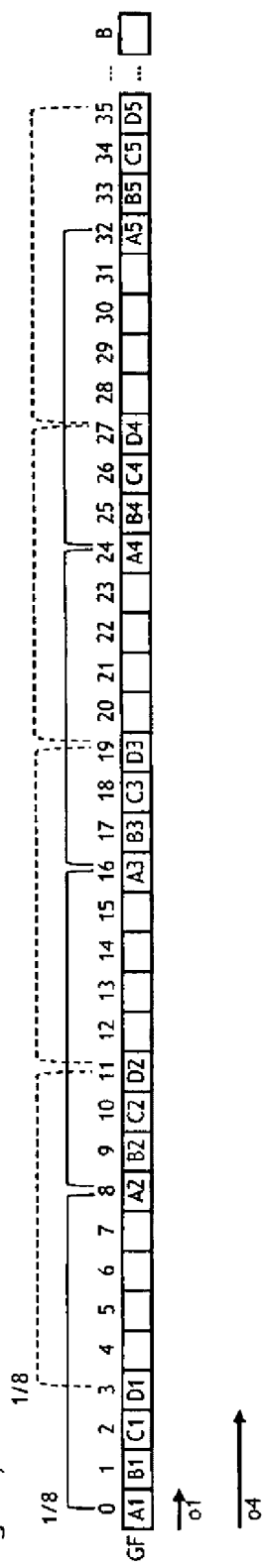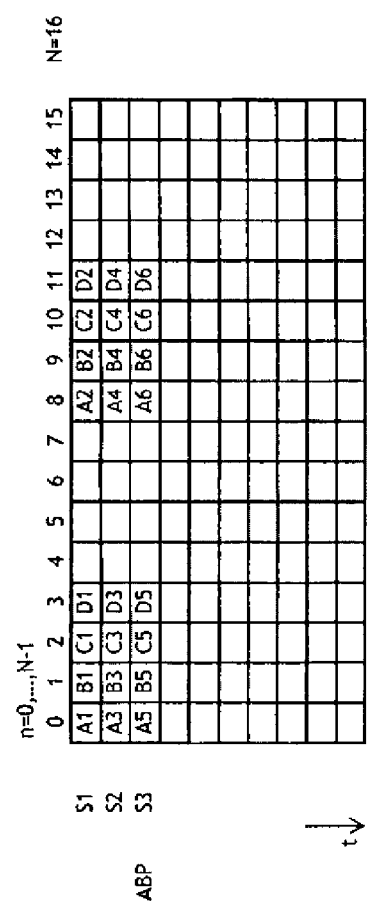

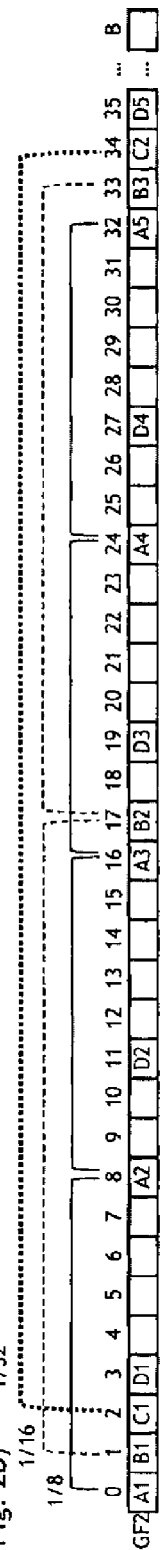
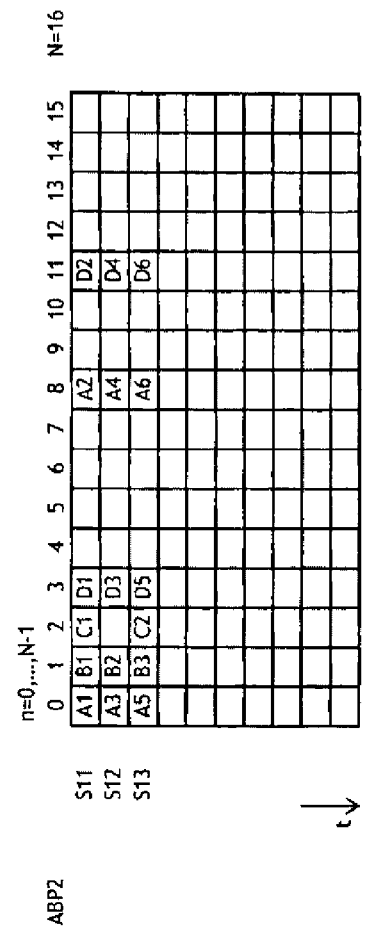
Fig. 2a
Fig. 2b)
Fig. 2c)

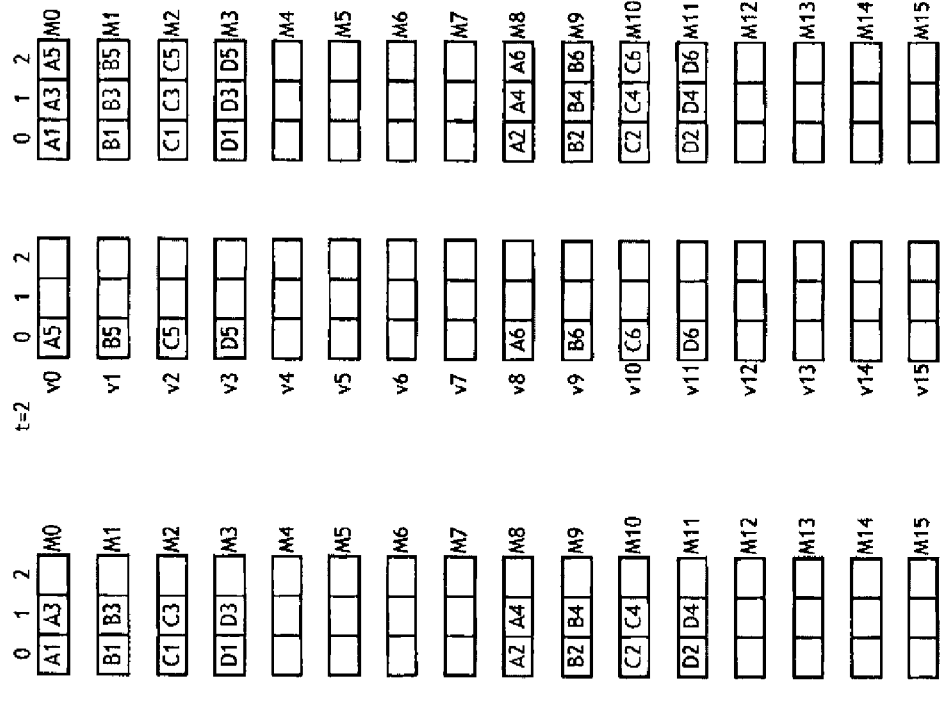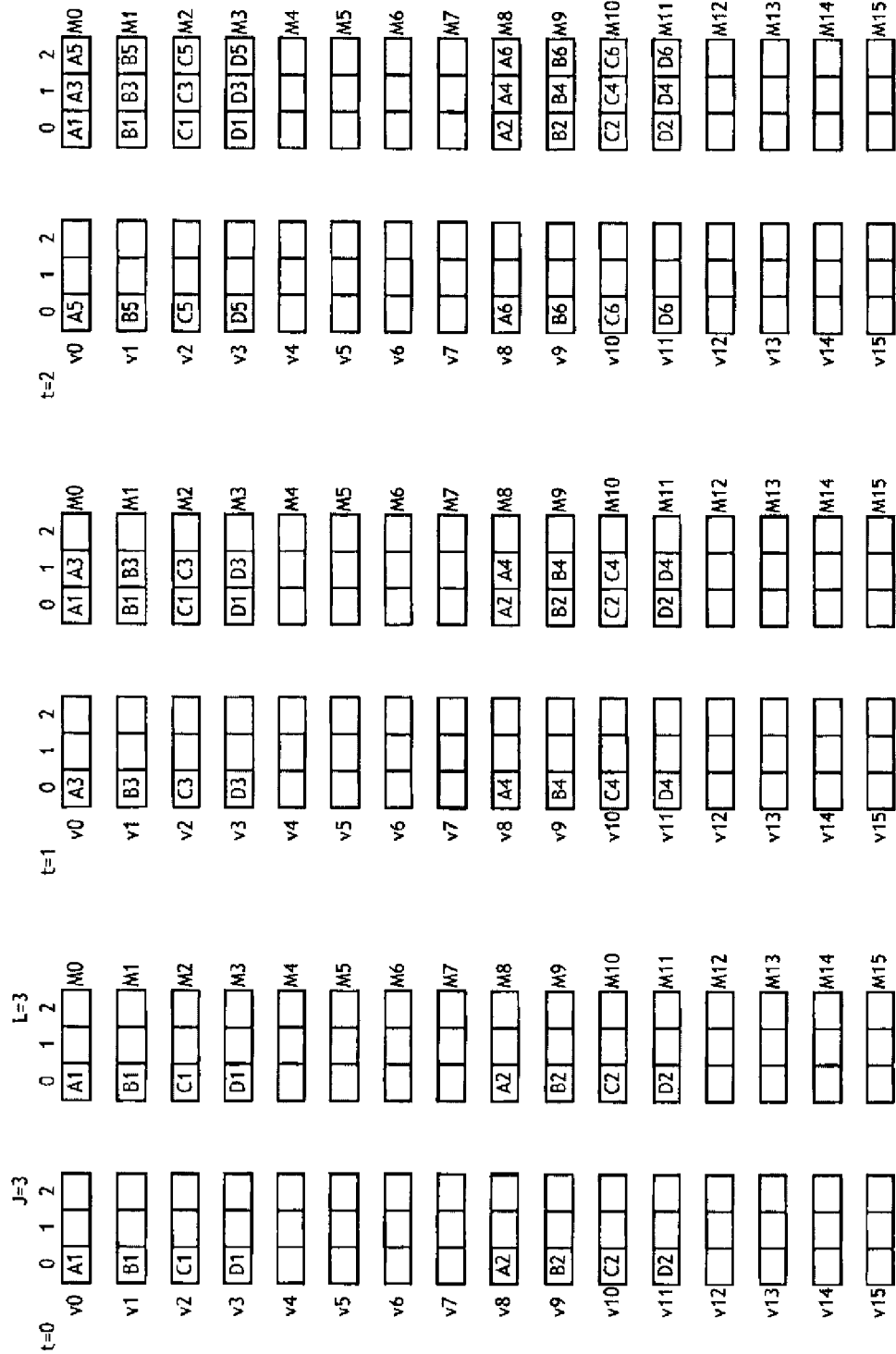
Fig. 3a
Fig. 3b
Fig. 3c

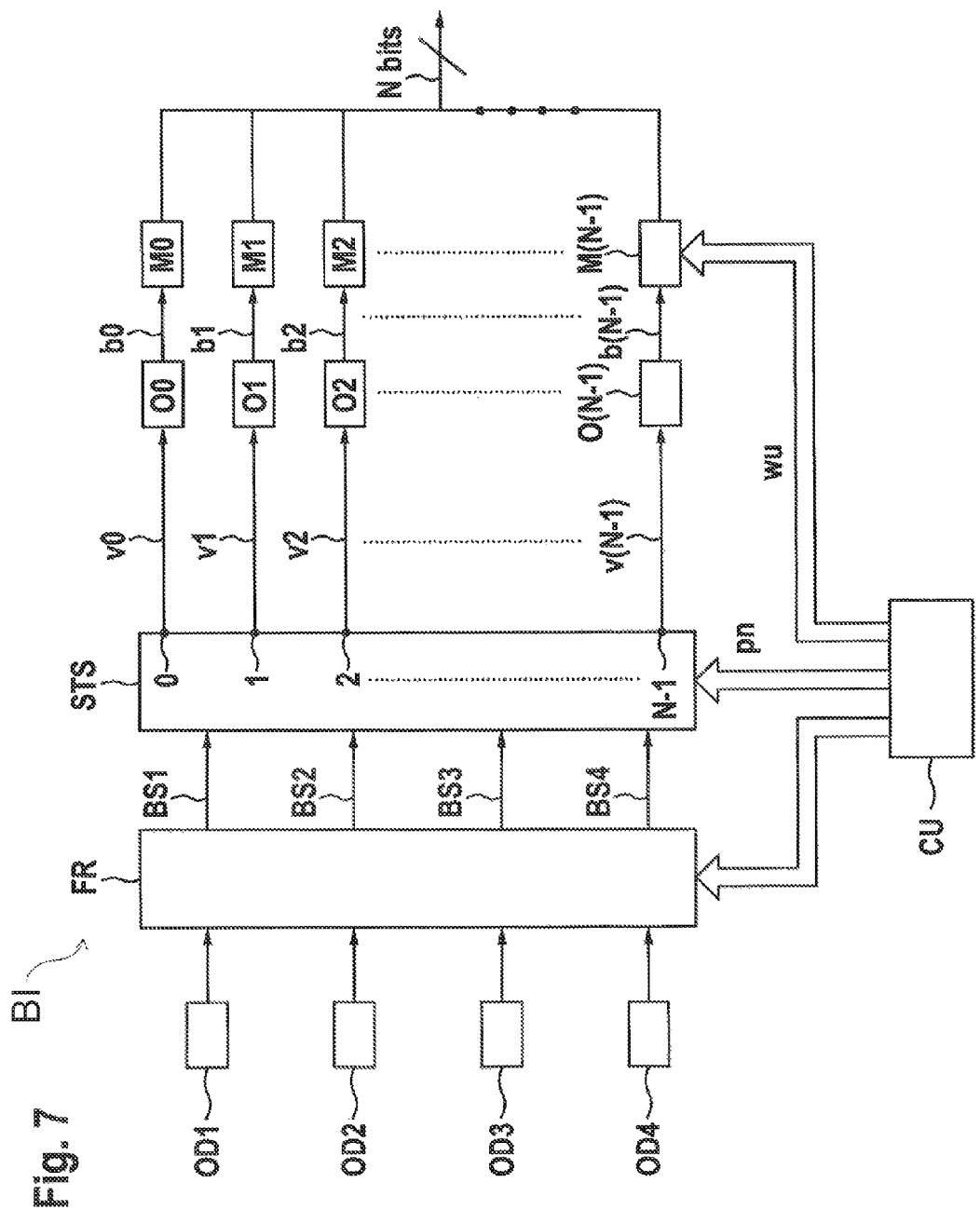

BIT-INTERLEAVER FOR AN OPTICAL LINE TERMINAL

FIELD OF THE INVENTION

The invention relates to the field of telecommunications, in particular to a bit-interleaver and a method of bit-interleaving for an optical line terminal of an optical access network.

BACKGROUND

Optical access networks are these days a prominent solution, for transmitting data from an optical line terminal to multiple optical network units. The optical line terminal is located at a central office, wherein the optical line terminal acts as an interface between the optical access network and a core network for data transmission. The optical line terminal receives data from the core network and transmits this in downstream direction towards the optical network units (ONU), to which customers may connect their equipment for data transmission. The downstream signal generated by the optical line terminal is transmitted into an optical feeder fiber, to which a remote node is connected. This remote node splits the downstream signal onto different optical branches, to which the different optical network units are connected.

One solution for transmitting different data streams assigned to different optical network units is, to allocate within the downstream signal for each optical network unit one or more time slots, within which multiple data bits of the data stream assigned to the respective optical network unit are placed by the optical line terminal. In such a solution, the respective optical network unit needs to receive within such a time slot data at a certain data rate, while during other time slots, assigned to other optical network units, the respective optical network unit does not need to receive data at any data rate. This implies, that the optical network unit has to be able to receive data within the designated time slot at a data rate, which is higher than the overall average data rate, by which the assigned data stream is transmitted from the optical line terminal to the respective optical network unit.

An alternative solution, within which an optical network unit may receive data from an optical line terminal at a constant data rate, is provided by a bit-interleaving protocol of a so-called bit-interleaving passive optical network (BI-PON). In such a BIPON, the bit data of different data streams assigned to different ONUs are interleaved within a global frame, such that the resulting data rate of each data stream for each ONU has a respective constant value. A global frame may contain for example up to 8*19,200 Bytes=153,600 Bytes, which is equal to 1,228,800 Bits. The bits of one specific data stream are placed within the global frame equidistantly to each other, which leads to a resulting constant data rate for this data stream. A global frame is then followed by further successive global frames for an ongoing data transmission.

The data rate for a specific data stream is defined by the number of bit positions, by which the bits of this data stream are spaced, assuming a given time duration of the global frame. By placing the bits of different data streams with different respective equidistant spacing within the global frame, different data rates are realized. The advantage of a BIPON is, that an ONU needs to receive data not at the overall data rate provided by the global frame, but at a lower data rate, which is defined by the time duration of the global frame and the rate, at which the bits of this specific data stream of this ONU are placed inside the global frame. This allows for operation of an ONU at a lower data rate than the maximum data rate realized by the successive global frames of a BIPON.

Even furthermore, by changing the rate at which data bits of a specific data stream are placed inside the global frame, a changed data rate is thus realized for the associated optical network unit.

Within a BIPON, an optical line terminal thus has to perform reception of different data streams assigned to different optical network units, and also has to perform a proper bit-interleaving of the bits of the different data streams into successive global frames, such that different pre-determined data rates are realized for the respective different optical network units.

SUMMARY

It is an objective of the invention to improve the known methods for bit-interleaving of different data streams at an optical line terminal.

Proposed is a bit-interleaver for an optical line terminal of an optical access network. The optical access network is preferably a passive optical network of the type BIPON.

The proposed bit-interleaver contains different sub-devices.

The bit-interleaver contains a memory reader, that is able to receive a number of M data streams assigned to respective optical network units. The memory reader provides these data streams at bit level to a space-time switch, which is a further sub-device of the bit-interleaver.

The space-time switch is able to read within one input cycle up to N respective bit sets from the respective M data streams.

Furthermore, the space-time switch is able to switch within one writing cycle up to N bits of the data streams onto up to N respective output ports. The respective output ports provide respective output vectors. The space-time switch performs switching of the respective bit sets at bit level.

The bit-interleaver contains furthermore N OR-function elements, that are able to determine within the writing cycle respective single output bits based on the respective output vectors. Thus, an OR-function element determines from one output vector the resulting single output bit, by combining the different bits of one output vector by a boolean OR-function.

The bit-interleaver contains furthermore N memory elements, which in turn contain each at least L bit sub-elements, wherein these bit sub-elements have respective sub-element addresses. The N memory elements are each operable to write within the one writing cycle a respective one of the respective single output bits into a respective one of their bit sub-elements.

The bit-interleaver contains furthermore a control unit that is able to control the reading of the M data streams by the space-time switch. Furthermore, the control unit is able to control the switching of the bits by the space-time switch onto the output ports of the space-time switch. Even furthermore, the control unit is able to control a choice of the writing addresses. The writing addresses are those addresses, at which the resulting single output bits are written into the respective bit sub-elements.

In order to grasp the advantages of the proposed bit-interleaver, the following aspects have to be taken into consideration.

When having to interleave bits of different data streams at an optical line terminal into a global frame of a bit-interleaving protocol, a simple solution would be, to write the different bits of the different data streams into one large memory according to the desired bit-interleaving pattern. Next, all the different bits of the global frame would be read out from the one large memory, after having written all the bits into the global memory. The result of this would be, that the first bit of the global frame could not read out from this large memory before the last bit has been written into this memory. Thus, all the data streams written into the single large memory holding the total global frame would experience a latency, that is equal to the time duration of the global frame.

The proposed bit interleaver has the advantage, that less than B data bits of the different M data streams can be written into the N memory elements and then be read out, after these bits have been written into these N memory elements. The number N of the memory elements is smaller than the maximum number B of bits present within a global frame. For example, within one writing cycle, N bits may be written into respective ones of the N memory elements, while after the completion of this writing cycle these N bits may be read out within a reading cycle, which may start just after the writing cycle has finished.

As previously mentioned, the number N of the memory elements is smaller than the maximum number B of bits present within a global frame. By reading out sets of N bits from the N memory elements at successive reading cycles, the resulting sets of N bits of the different reading cycles can be concatenated as a bit stream that forms the bit stream of the global frame. Thus, writing and reading of N interleaved bits using the N memory elements can be performed for the purpose of data transmission even before all B bits of the global frame have been written into the memory elements. This reduces the latency of the bit interleaver to a great extent in comparison to the previously described simple method using only one single memory device.

Even furthermore, since the control unit controls the reading of the different data streams by the space-time switch, the switching by the space-time switch and also the choice of the writing addresses used for writing resulting single bits into the bit sub-elements of the memory element, the control unit is able to easily change the different data rates for the different data streams, which in turn achieves a great flexibility.

To summarize the above, the proposed bit-interleaver realizes high-speed bit-interleaving with low latency and great flexibility. Even furthermore, due to the fact, that only N memory elements have to be used, the power consumption is reduced in comparison to the proposed simple method of using one large memory for holding all the B bits of a global frame within this one large memory.

BRIEF DESCRIPTION OF THE FIGURES

FIGS. 1a, b and c show a bit-interleaving principle for different data streams at same data rates.

FIGS. 2a, b and c show a bit-interleaving principle for different data streams at different data rates.

FIGS. 3a, b and c show resulting output vectors with different memory states for different memory elements at different time instances for the bit-interleaving method realizing same data rates for the different data streams.

FIGS. 4a, b and c show different resulting output vectors together with different states of different memory elements at different time instances for the bit-interleaving method realizing different data rates for the different data streams.

FIG. 7 shows a proposed bit interleaver according to a preferred embodiment.

DESCRIPTION OF EMBODIMENTS

Figure 5:
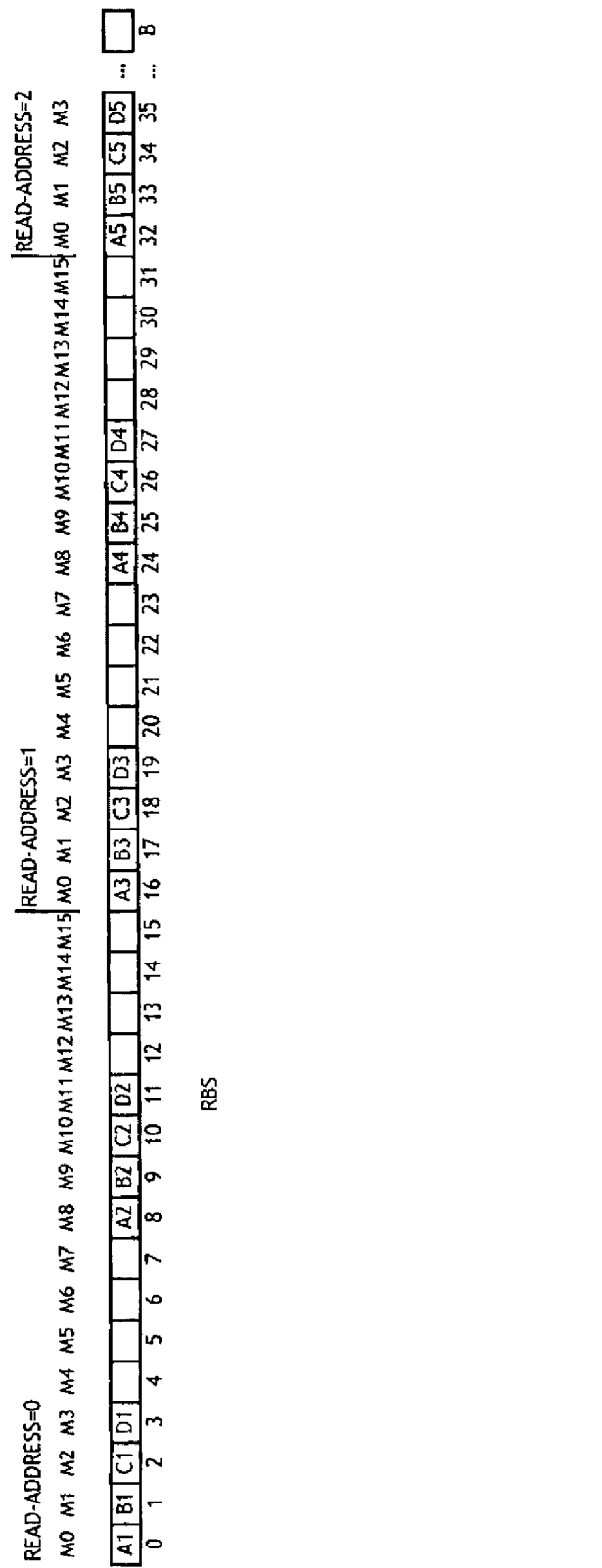
FIGS. 5 and 6 show resulting data streams obtained by reading sets of bits from the memory elements.

FIG. 7 shows a proposed bit-interleaver BI.

The bit interleaver BI contains a FIFO-reader FR, which receives M different data streams OD1, . . . OD4. The FIFO-reader is one example of a memory reader that can be used for receiving and reading the different data streams OD1, . . . OD4. Alternative types of memory readers may be used instead.

In this example, the number M of the data streams is chosen to M=4 without any limitation.

The FIFO-reader FR provides the different data streams OD1, . . . , OD4, to a space-time switch STS. The different data streams OD1, . . . , OD4 are data streams assigned to respective optical network units.

The space-time switch STS receives within a reading cycle up to M respective bit sets BS1, . . . BS4, which are extracted from the respective data streams OD1, . . . , OD4. Each of the bit sets BS1, . . . BS4 contains K bits. In this example, the number K of the bits within a bit set is chosen to K=8 without any limitation.

The space-time switch STS may receive within one reading cycle a set of K=8 bits from each of the data streams OD1, . . . OD4. In this case, the data rate, at which the different data streams OD1, . . . , OD4 are read, is the same for all data streams. For realizing different data rates for the different data streams OD1, . . . , OD4, the space-time switch STS may read within different successive reading cycles different numbers of bit sets from the different data streams OD1, . . . , OD4. For example, within a first reading cycle, the space-time switch STS may read from each of the data streams OD1, . . . OD4 respective bit sets BS1, . . . , BS4, while in the next following reading cycle the space-time switch STS reads respective bit sets BS1, BS2 only from the data streams OD1, OD2. The result of such reading of bit sets within different reading cycles by the space-time switch is, that the data streams OD1, OD2 experience a reading at a data rate, that is twice the data rate, at which the data streams OD3, OD4 are being read.

The space-time switch STS switches within one writing cycle up to N bits onto up to N output ports of the switch STS. At each of the N output ports, a respective output vector v0, . . . , v(N−1) is provided. In which way the switch STS switches the bits of the data streams into the output vectors v0, . . . , v(N−1) will be described in detail later on.

A control unit CU is connected to the switch STS and the reader FR. Thus, the control unit CU controls the reading of the data streams from the reader FR by the space-time switch STS. Furthermore, the control unit CU controls, in which way the switch STS switches the read bits onto the output ports and thus into the respective output vectors v0, . . . , v(N−1).

The resulting output vectors v0, . . . , v(N−1) are then provided to respective OR-function elements O0, . . . , O(N−1). The output vectors v0, . . . , v(N−1) are of a bit length of J=3. The bit length of the output vectors is chosen in this example to J=3 without any limitation.

The OR-function element O0 determines within one writing cycle a single output bit b0 based on the output vector v0. For this, the OR-function element O0 combines all bits present within the vector v0 by a boolean OR-function. The respective further OR-function elements O1, . . . , O(N−1)

determine from the respective vectors v1, . . . , v(N−1) respective single output bits b1, . . . , b(N−1).

The control unit CU controls the reading addresses used for reading up to N bits from the respective N memory elements within one reading cycle.

The reason, why such a reduction of the output vectors v0, . . . , v(N−1) to the output bits b0, . . . , b(N−1) is necessary, is that within one writing cycle, each of the vectors v0, . . . , v(N−1) contains only one bit that is switched by the switch STS. The reason for this in turn is, that using a space-time switch STS for switching the bits of the bit streams onto output vectors at the different output ports is a prominent solution, but due to internal scheduling properties of such a switch STS, it cannot be guaranteed that at each instance of a writing cycle one of the bits of the data streams can be switched into exactly the first bit position of an output vector v0, . . . , v(N−1). In the case, that not all bits of a bit set BS1, . . . , BS4 are switched onto respective output ports of the switch STS within a same writing cycle, one or more bits of such a bit sequence BS1, . . . , BS4 has to be delayed internally by the space-time switch STS, which in turn causes such a delayed bit to be placed inside one of the output vectors v0, . . . , v(N−1) at a bit position that is different from the first bits position of the output vector. However, using a space-time switch with output vectors v0, . . . , v(N−1) for the bit-interleaver BI is a favorable solution, since such a switch STS is a prominent device for switching bits from different input ports to different output ports. The resulting shift of a switched bit to a resulting bit-position within an output vector is compensated for by the OR-function elements O0, . . . , O(N−1).

The determined single output bits b0, . . . , b(N−1) are then provided to respective memory elements M0, . . . , M(N−1). Each of the N memory elements M0, . . . , M(N−1) comprises at least L bit sub-elements with respective addresses. Within one writing cycle, a memory element M0, . . . , M(N−1) writes a respective single output bit b0, . . . , b(N−1) into one of its sub-elements at bit level. The choice of the writing address, which determines to which bit sub-element a memory element M0, . . . , M(N−1) writes the respective received output bit b0, . . . . . , b(N−1), is chosen by the control unit CU. This choice of the writing address in detail will be described later on.

The proposed bit-interleaver BI is able to provide within one writing cycle up to N output bits at the respective memory elements M0, . . . , M(N−1), from which these output bits can be read out as a whole within one reading cycle. Thus, after having written within one writing cycle up to N bits into the memory elements M0, . . . , M(N−1), these N bits can then be read out within a reading cycle just after the N-th bit has been written into one of the memory elements M0, . . . , M(N−1). The bit-interleaver BI does not have to perform writing of all B bits of a global frame into a large memory, before extracting the whole global frame.

The bit-interleaver BI may process writing of up to N bits each within successive writing cycles into the memory elements and may then read out successive sets of N bits in following reading cycles for forming successive bits of a corresponding global frame. Thus, the proposed bit-interleaver BI achieves a reduced latency in comparison to the solution when writing all bits of a global bit-interleaving frame into a whole memory and then reading out the whole global frame after having written all bits into the single large memory.

Even furthermore, since the rates, at which the switch STS reads the bit-sets BS1, . . . , BS4 of the data streams OD1, . . . , OD4, is controlled by the control unit CU, and since furthermore the switching properties of the switch STS as well as the reading and the writing addresses of the memory elements M0, . . . , M(N−1) are controlled by the control unit CU, the proposed bit-interleaver is a solution of great flexibility, allowing the control unit CU to achieve different data rates for the different data streams OD1, . . . , OD4 with a low latency at high speed bit-interleaving. Even furthermore, since only N memory elements M0, . . . , M(N−1) are used, the power consumption imposed by the proposed bit-interleaver BI is smaller than a solution, in which a whole global frame of B bits has to be written into a memory holding these B bits.

Preferably, the control unit CU is provided with pre-determined data rates R(i), wherein the index i of a data stream in this example ranges from i=1, . . . , M=4. The control unit CU uses these pre-determined data rates R(i), for controlling the reading of the bits sets BS1, . . . , BS4 by the space switch STS from the FIFO reader FR. Furthermore, the control unit CU is provided with pre-determined offset values o(i), with index i, which define an offset of the different bits of the different data streams OD1, . . . , OD4 within a global frame. The function of these offsets will be described in detail later on.

Even furthermore, the control unit CU is provided with a pre-determined value B of bits present within a global frame and also the number N of the memory elements, as well as the number L of the bit sub-elements of a memory. Thus, the control unit CU chooses the output port and the writing addresses in dependence on pre-defined data-rates, pre-defined offset values, a maximum number B of bits present within a frame, the number N of memory elements and the number L of bit sub-elements.

FIG. 1a shows different bit streams OD1, . . . , OD4 together with the bits A1, . . . , A8, B1, . . . , B8, C1, . . . , C8, D1, . . . , D8 as sequences over time t.

FIG. 1b shows a bit-interleaving pattern of a global frame GF, in which the different bits of the data streams from the FIG. 1a are interleaved. FIG. 1b shows the interleaving of the different bits of the data streams for the case, that the data rates R(1), R(2), R(3), R(4) are all equal to 1/8 for all the data streams. In other words, all data streams have same rates R(1), . . . , R(4). The maximum number B of bits present within the global frame GF may be for example 1,228,800 bits. Such a global frame may have a time duration of 122 microseconds.

The first bit of the data stream OD1, which is the bit A1, is placed at the bit position 0 of the global frame GF. Due to the fact, that the rate R(1) chosen for the bit stream OD1 is 1/8, the next bit A2 of the data stream OD1 is placed 8 further bits apart from the first bit A1, such that the bit A2 is placed in the bit position 8. Further bits A3, A4, A5 of the data stream OD1 follow at next bit positions 16, 24, 32 within the global frame GF.

For the shown BIPON bit-interleaving scheme placing bits within a global frame, the bit position $bp(x(i),i)$ of the x-th bit of the data stream with index i can be in general determined, by using the reciprocal value $r(i)=1/R(i)$ of the rate R(i), an offset value o(i) and an integer value x(i). The integer value x(i) corresponds to the index number of the x-th bit and is thus an integer number ranging from $x(i)=0$ up to the integer value $x(i)=int(B/r(i))$. Thus, the bit position $bp(x(i),i)$ of the x-th bit of the data stream with index i can be determined for decimal numbers as $$bp(x(i),i)=o(i)+r(i)*x(i).$$

Thus, the control unit CU determines for the x-th bit of the i-th data stream a corresponding bit-position within the global frame as described above in detail.

In this example, the offset value o(1) is chosen to o(1)=0 for the data stream OD1.

In FIG. 1b, it is also shown the relationship of the bits D1, D2, . . . of the data stream OD4 within the global frame GF. Due to the fact, that the rate R(4) is also chosen as R(4)=1/8 for this bit-interleaving scheme, also the bits D1, D2, . . . of the data stream OD4 are each spaced 8 bit positions apart within the global frame GF. The offset value o(4) is chosen as the value O4=3 in this example. The offset values for the bits of the data streams OD2, OD3 are not explicitly shown in the FIG. 1b, but it can be said, that the offset value o(2) is chosen to the value o(2)=1, while the offset value o(3) is chosen to the value o(3)=2.

Looking at FIG. 1b, it becomes clear, that optical network units receiving this global frame GF may perform reception of bits of one of the data streams at a data rate, which is equal to data rate of the global frame GF divided by 8.

FIG. 1c shows an alternative bit pattern ABP, in which the different bits of the global frame shown in FIG. 1b are split into sets of N bits. Over time, different sets of N bits may be read out from the memory devices M0, . . . , M(N-1) shown in FIG. 7, and later on be successfully transmitted for realizing a transmission of a bit sequence corresponding to the global frame GF shown in FIG. 1b.

The first set, which has to be read in a first reading cycle from the memories M0, . . . , M(N-1) shown in FIG. 7, is the set S1. The bits of this set S1 correspond to those bits, which are stored within the bit positions 0 to 15 of the global frame GF of FIG. 1b.

Within a next reading cycle, the next set of bits S2, shown in the FIG. 1c, shall be read out from the memory elements M0, . . . , M(N-1) shown in FIG. 7. These are the bits allocated to the bit positions 16 to 31 of the global frame GF shown in FIG. 1b.

Within a third reading cycle, the set of bits S3, shown in FIG. 1c, shall be read out from the memory elements M0, . . . , M(N-1) shown in FIG. 7. These are the further bits starting at the bit positions 32 of the global frame GF shown in FIG. 1b.

It will be now explained in detail, in which way different bits of different data streams are to be switched by the switch STS and written to the memories M0, . . . , M(N-1), shown in FIG. 7, and furthermore also read from these memories.

It shall be assumed, that the switch STS reads within one input cycle bit sets BS1, . . . , BS4 of K=8 bits each from the fiber reader FR. Within a writing cycle, the space time switch STS switches the first and the second bit of the bit sets BS1, . . . , BS4 onto respective output ports and thus into the respective vectors v0, . . . , v15, as shown in FIG. 3a. Due to internal scheduling properties of the switch STS, the switched bits are present within first bit positions, with the index 0, within the output vectors v0, . . . , v15. As an example, the bit length of the output vectors v0, . . . , v15 is chosen to J=3 as a non-limiting example.

The number of the output port and thus also the number of the corresponding output vector, to which the switch STS switches at specific bit, is controlled by the control unit CU. The control unit CU determines the number of the output port, and thus the number of the output vector and also the resulting number of the memory M0, . . . , M(N-1), to which a bit is switched, as the port number pn(x(i),i)=bp(x(i),i) mod N for decimal numbers. For each bit, the bit position by may be determined by the control unit CU as previously described above.

FIG. 3a shows furthermore the different states of the different memory elements M0, . . . , M15 at a time instance t=0. The different OR-function elements reduce the different output vectors v0, . . . , v15 to single output bits b0, . . . , b(N-1), which are then written into respective bit-sub-elements of respective memories M0, . . . , M(N-1), wherein these bit-sub-elements are of a same writing address. In this example, the writing address is equal to 0. The control unit CU determines within one writing cycle for the x-th bit of the i-th data stream the writing address wa in dependence on the bit position of the x-th bit of the i-th data stream and the number L. In detail, the writing address wa of the x-th bit of the i-th data stream can be determined for decimal numbers as wa(x(i),i)=int(bp(x(i),i)/L).

Looking at the memory elements M0, . . . , M15 at the time instance t=0, an appropriate set of N bits, shown as the bit set S1 in FIG. 1c, can be read from the memories, by reading out all the memories M0, . . . , M15 at one time instance with a same reading address. In this example, the reading address is equal to the value 0.

This reading has not to be performed exactly at a time instance at which the bits have finally been written into the memory elements M0, . . . , M15, but may be performed at a later point in time. The reading of the bits from the memory elements M0, . . . , M15 with the appropriate reading address is controlled and determined by the control unit CU shown in FIG. 7.

Within a next writing cycle, the switch switches bits of the different data streams onto output ports and into corresponding output vectors v0, . . . , v15 at the time instance t=1, as shown in FIG. 3b. The placement of the bits A3, . . . , D4 at a bit position 0 within the vectors v0, . . . , v15 is caused by internal scheduling properties of the switch.

As previously described, the mentioned OR-function elements O0, . . . , O(N-1), shown in FIG. 7, generate single output bits, which are then written at this time instance t=1 into respective bit sub-elements of the memory elements M0, . . . , M15, as shown in FIG. 3b.

Within this next writing cycle, the control unit CU determines for the x-th bit of the i-th data stream the number of the output port and thus the number of the memory element, to which the resulting output bit is written, as the port number pn in dependence on the bit-position bp(x(i),i). In detail, the control unit CU determines for the x-th bit of the i-th data stream the port number pn for decimal numbers as pn(x(i),i)=bp(x(i),i)mod N.

Furthermore, using the respective bit positions by of the different bits A3, . . . , D4, the control unit CU of FIG. 7 determines the writing address wa for decimal numbers as wa(x(i),i)=int(bp(x(i),i)/L).

By looking at FIG. 3b, it becomes evident, that a next set of N=16 bits can be read out from the memory elements M0, . . . , M15, by reading out the 16 bits present within these memory elements at same reading addresses, which is in this example are the reading address of the value 1.

Thus, when having to read successive sets of N bits from the different memory elements, for forming a bit sequence corresponding to a global frame of a BIPON scheme, one may simply read out such N bits from the N memory elements, using a same reading address for all of these N memory elements within a same reading cycle and then simply increasing the reading address for the next reading cycle.

For the further bits A5, . . . , D6, the FIG. 3c shows for a next time instance t=2, in which way the proposed choice for switching these bits and writing these bits into the memories M0, . . . , M15 leads to a placement of the bits within the memory elements at specific bit sub-elements.

A resulting bit sequence RBS, shown in FIG. 5, results from reading sets of N bits from the N memory elements with a same reading address within each respective reading cycle. By comparing the resulting bit sequence RBS of FIG. 5 with the initially desired bit sequence of the global frame GF in FIG. 1b, it become clear, that the proposed bit-interleaver BI in FIG. 7 is able to perform the desired bit-interleaving of a global frame shown in FIG. 1b.

FIG. 2a shows once again the different data streams OD1, . . . , OD4.

FIG. 2b shows a desired bit sequence of a global frame GF2 in the case, that the data stream OD1 shall be interleaved at a rate of 1/8 and also the data stream OD4 shall be interleaved at a rate 1/8, while the data stream OD2 shall be interleaved at a rate of 1/16 and the data stream OD3 shall be interleaved at rate of 1/32.

The offset values of the different data streams are chosen as previously described with regard to FIG. 1b.

FIG. 2c shows the corresponding alternative bit pattern ABP2 with sets of N=16 bits over time t. The resulting sets of bits S11, S12, S13 are such, which shall be present within the memory elements M0, . . . , M(N−1) at bit sub-elements of same addresses, as shown in FIG. 7.

Figures 4A, 4B, 4C:
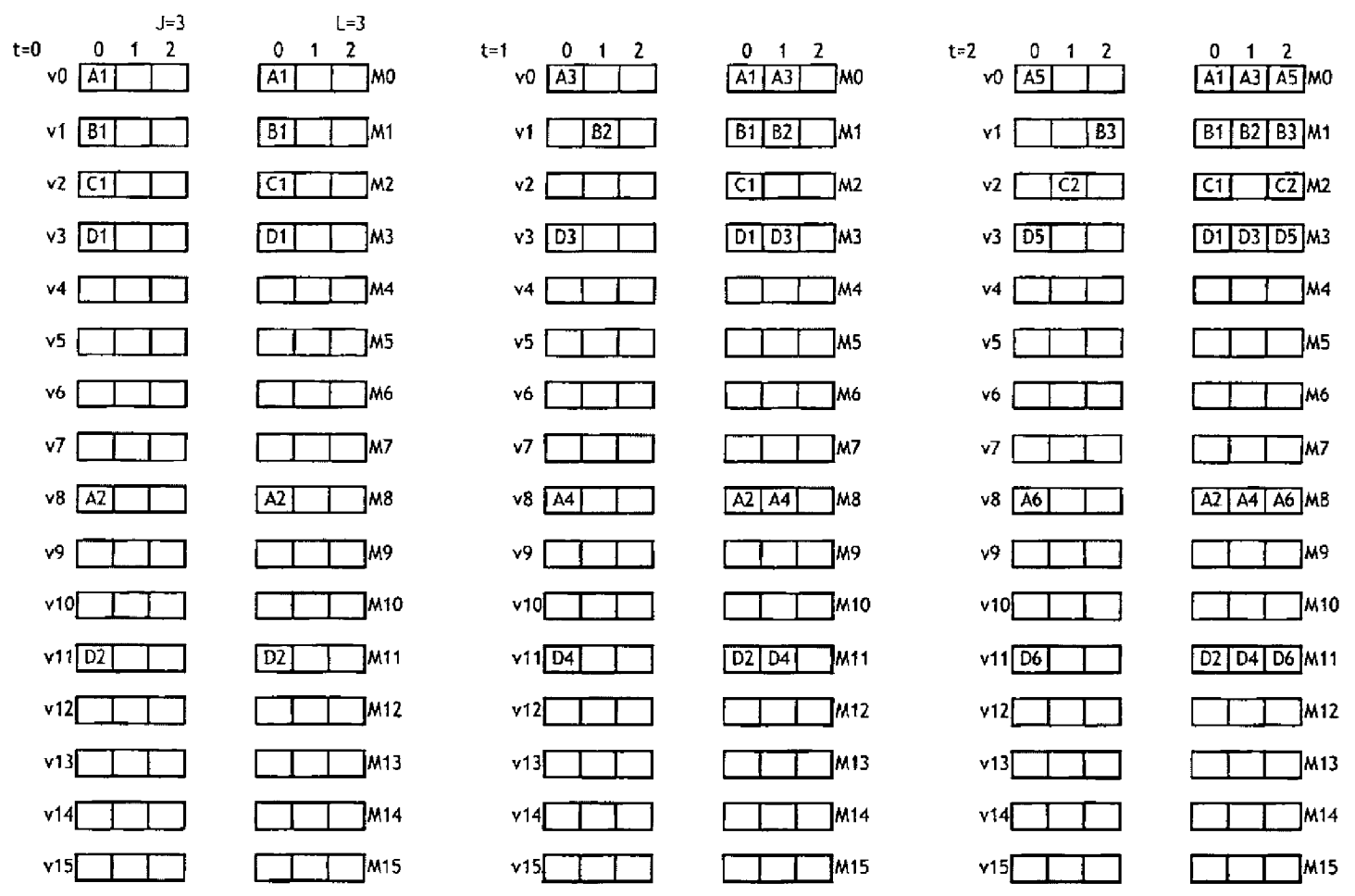

FIG. 4a shows the resulting placement of the different bits A1, . . . , D2 within the output vectors v0, . . . , v15, as well as the memory element M0, . . . , M15.

At the next time instance t=1, the bits of the set S12 shown in FIG. 2c have to be placed within the output vectors v0, . . . , v15, as shown in FIG. 4b.

Due to the fact, that the bit B2 has to be switched by the space time switch STS, shown in FIG. 7, the internal scheduling properties of this switch STS cause a placement of this bit B2 within the bit position of the value 1 in the output vector v1. As previously described in detail, the OR-function elements achieve a reduction of the respective output vectors v0, . . . , v15 to respective output bits b0, . . . , b(N−1), as shown in FIG. 7.

The resulting single output bits are then written within one writing cycle corresponding to the time instance t=1 into bit sub-elements of the writing address wa(x(i),i)=int(bp(x(i),i)/L).

For the next further time instance t=2, FIG. 4c shows the placement of the different bits within the output vectors v0, . . . , v15 as well as within bit-sub-elements of a same writing address, equal to the value 2, of the memory elements M0, . . . , M15.

By looking at FIG. 4c at the right hand side, it becomes evident, that it is now possible to read out at successive reading cycles respective sets of N bits from the different memory elements M0, . . . , M15, wherein within one reading cycle a same reading address is used for choosing the bit sub-element of each memory element M0, . . . , M15.

Figure 6:
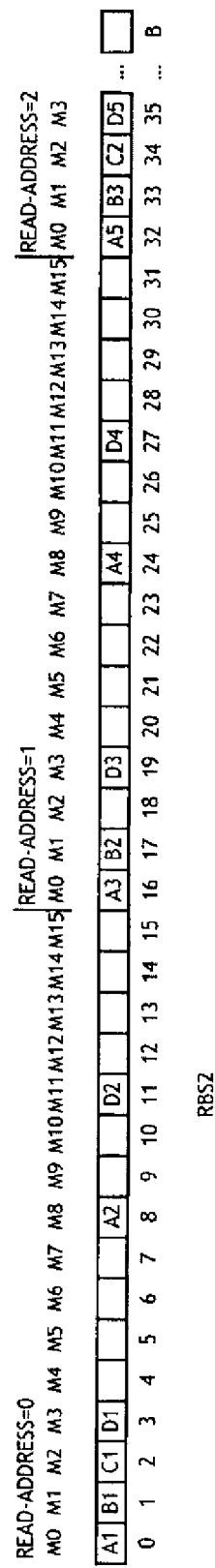

By reading out sets of N bits from the memory elements as previously described above within successive reading cycles, a resulting bit pattern RBS2 can be achieved, as shown in FIG. 6. By comparing the bit sequence RBS2 of FIG. 6 with the desired bit sequence of bits of the global frame GF2 of FIG. 4b, it becomes evident, that the proposed bit-interleaver BI shown in FIG. 7 achieves the desired method of bit-interleaving needed for a BIPON.

The choice of the number of bit sub-elements to L=3 is only an exemplary choice. Preferably the number of bit-sub-elements present within a memory element is chosen to L=1024.

For achieving an overall data rate of 10 gigabit per second, one may choose the number of N to 64, while reading out such sets of N bits at a rate or frequency of f=156, 25 MHz. As an alternative example, sets of N=32 bits may be written and read at a frequency of f=312, 5 MHz for achieving the same bit rate of 10 gigabit per second. Even alternatively, one may choose the number of N to N=128 with a reading frequency of f=78, 125 MHz.

It is an evident advantage of the proposed bit-interleaver BI shown in FIG. 7, that the global latency of the system is low, since the reading process of interleaved bits from the memory elements M0, . . . , M(N−1) can be started, before all the interleaving processes of all bits forming a global frame is finished.

Preferably, the different sub-devices of the bit-interleaver BI shown in FIG. 7 are implemented within a single field programmable gate array (FPGA), in the case that the memory reader is a FIFO-reader.

The functions of the various elements shown in the FIG. 7, including any functional blocks labeled as 'control unit', may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term 'control unit' should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

The invention claimed is:

1. A Bit-Interleaver for an Optical Line Terminal of an Optical Access Network, comprising:
   a memory configured to receive and provide a first number of data streams assigned to respective optical network units,
   a space-time configured to,
      read within one input cycle up to the first number of bit-sets from said data streams, and
      switch within one writing cycle up to a second number of bits of said data streams to up to the second number of output ports in order to provide output vectors,
   the second number of OR-function elements configured to determine within said one writing cycle single output bits based on one of said output vectors, by combining all bits of the one of said output vectors by a Boolean OR-function;
   the second number of memory elements, each of the memory elements including at least a third number of bit sub-elements having sub-element writing addresses, each of the memory elements configured to write within said one writing cycle one of the single output bits into one of the bit sub-elements; and a control unit configured to control,
the reading of said data streams by said space-time switch,
the providing of, the output vectors to the output ports by said space-time switch, and
a selection of the sub-element writing addresses of said bit sub-elements, based on data rates, offset values, a maximum number of bits within a bit-frame, a maximum number of the output ports of the space-time switch, and a minimum number of the bit sub-elements of the memory elements.

2. The Bit-Interleaver according to claim 1, wherein
said control unit is configured to control said space-time switch, such that said data streams are read at said data rates, and
said control unit is configured to choose within said one writing cycle said writing addresses of said bit sub-elements to a same address value.

3. The Bit-Interleaver according to claim 1, wherein each of said bit-sets read from said respective data streams contains K bits.

4. The Bit-Interleaver according to claim 1, wherein said control unit is furthermore configured to control respective reading addresses for reading within one reading cycle respective one of the second number of bits from said second number of memory elements.

5. The Bit-Interleaver according to claim 1, wherein said control unit is configured to choose within said one reading cycle said reading addresses to a same address value.

6. An Optical Line Terminal for an Optical Access Network, comprising a Bit-Interleaver according to claim 1.

7. A method of bit-interleaving for an Optical Access Network, comprising:
receiving and providing a first number of data streams assigned to respective optical network units;
reading within one input cycle up to the first number of bit-sets from said data streams, using a space-time switch;
switching within one writing cycle up to a second number of bits of said data streams to up to the second number of output ports in order to provide output vectors, using said space-time switch;
determining within said one writing cycle single output bits based on one of said output vectors, by combining all bits of the one of said output vectors by a Boolean OR-function;
writing within said one writing cycle one of the single output bits into a bit sub-element of the second number of memory elements, wherein said bit sub-element has has a respective sub-element address;
controlling,
the reading of said data streams by said space-time switch,
the providing of, the output vectors to the output ports by said space-time switch, and
a selection of the sub-element writing addresses of said bit sub-elements, based on data rates, offset values, a maximum number of bits within a bit-frame, a maximum number of the output ports of the space-time switch, and a minimum number of the bit sub-elements of the memory elements.

* * * * *